(12) United States Patent
Nagai

(10) Patent No.: US 8,044,524 B2
(45) Date of Patent: Oct. 25, 2011

(54) ADHESIVE FOR CONNECTION OF CIRCUIT MEMBER AND SEMICONDUCTOR DEVICE USING THE SAME

(75) Inventor: Akira Nagai, Tsukuba (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 12/500,114

(22) Filed: Jul. 9, 2009

(65) Prior Publication Data

US 2010/0013078 A1    Jan. 21, 2010

Related U.S. Application Data

(63) Continuation of application No. PCT/JP2008/050140, filed on Jan. 9, 2008.

(30) Foreign Application Priority Data

Jan. 10, 2007    (JP) ................ P2007-002308

(51) Int. Cl.
    *H01L 29/40*    (2006.01)
    *H01L 23/29*    (2006.01)
(52) U.S. Cl. .......... 257/788; 257/778; 257/789
(58) Field of Classification Search .......... 257/778, 257/788, 789
    See application file for complete search history.

(56) References Cited

U.S. PATENT DOCUMENTS

| | | | |
|---|---|---|---|
| 4,720,424 A * | 1/1988 | Eickman et al. | 428/323 |
| 7,218,007 B2 * | 5/2007 | Shi et al. | 257/778 |
| 7,723,407 B2 * | 5/2010 | Sugioka et al. | 523/443 |
| 7,795,744 B2 * | 9/2010 | Chen et al. | 257/793 |
| 2001/0003058 A1 * | 6/2001 | Gilleo et al. | 438/612 |
| 2002/0076910 A1 * | 6/2002 | Pace | 438/613 |
| 2002/0157247 A1 * | 10/2002 | Li | 29/840 |
| 2004/0012098 A1 * | 1/2004 | Yamazaki et al. | 257/778 |
| 2006/0160939 A1 * | 7/2006 | Starkovich | 524/406 |
| 2007/0141330 A1 | 6/2007 | Morishima et al. | |

FOREIGN PATENT DOCUMENTS

| | | |
|---|---|---|
| JP | 63-185803 A | 8/1988 |
| JP | 7211145 A | 8/1995 |
| JP | 2833111 B2 | 12/1998 |
| JP | 2004-269626 A | 9/2004 |
| JP | 2006-49482 A | 2/2006 |
| JP | 2006-199778 A | 8/2006 |
| KR | 10-2002-0066988 A | 8/2002 |
| KR | 10-2005-0028807 A | 3/2005 |
| KR | 10-2006-0090601 A | 8/2006 |
| WO | 2006/132165 A1 | 12/2006 |

OTHER PUBLICATIONS

International Search Report issued in corresponding application No. PCT/JP2008/050140, completed Apr. 3, 2008 and mailed Apr. 15, 2008.

* cited by examiner

*Primary Examiner* — Mathew Landau
*Assistant Examiner* — James M Mitchell
(74) *Attorney, Agent, or Firm* — Griffin & Szipl, P.C.

(57) ABSTRACT

An adhesive for connecting circuit members, which is interposed between a semiconductor chip having protruding connecting terminals and a board having wiring patterns formed thereon for electrically connecting the connecting terminals and the wiring patterns facing each other and bonding the semiconductor chip and the board by applying pressure/heat, containing a resin composition containing a thermoplastic resin, a crosslinkable resin and a hardening agent for forming a crosslink structure of the crosslinkable resin; and composite oxide particles dispersed in the resin composition.

13 Claims, 11 Drawing Sheets

(a)

(b)

(a)

(b)

ADHESIVE FOR CONNECTION OF CIRCUIT MEMBER AND SEMICONDUCTOR DEVICE USING THE SAME

CROSS-REFERENCE TO RELATED APPLICATIONS

This is a Continuation Application of PCT application No. PCT/JP2008/050140, filed on Jan. 9, 2008.

This application is based upon and claims the benefit of priority from prior Japanese Patent Application No. 2007-002308, filed Jan. 10, 2007, the entire contents of which are incorporated herein by reference.

TECHNICAL FIELD

The present invention relates to an adhesive for connecting circuit members and a semiconductor device using the same. More specifically, the present invention relates to a circuit-member connecting adhesive for connecting semiconductor elements to a circuit board in accordance with a face-down bonding system with application of heat and pressure, a circuit-member connecting adhesive (circuit-member connecting anisotropic conductive adhesive) having conductive particles dispersed therein and a semiconductor device using these.

BACKGROUND ART

Generally, as a system for directly mounting semiconductor chips (hereinafter sometimes simply referred to "chips") on a circuit board in accordance with a face-down bonding system, a system in which solder bumps are formed on electrode portions of semiconductor chips, which are connected to a circuit board by soldering, and a method in which a conductive adhesive is applied to protruding electrodes provided to semiconductor chips for electrically connecting to circuit-board electrodes, are known.

These systems have problems. When a chip and a board are exposed to various environments, stress is produced in the connection interface ascribed to a difference in thermal expansion coefficient between the chip and the board to be connected, with the result that connection reliability decreases. Therefore, in order to reduce the stress in the connection interface, a system for filling the gap between the chip and the board generally with an underfill material such as an epoxy resin has been studied.

As a filling system with the underfill material, mention may be made of a system in which a chip and a board are connected and thereafter a low-viscosity liquid resin is injected and a system in which an underfill material is placed on a board and then a chip is mounted. In the meantime, as a method in which an underfill material is previously placed on a board and then a chip is mounted, a method of applying a liquid resin and a method of attaching a resin film are known.

However, in the case of applying a liquid resin, it is difficult to accurately control the application amount by a dispenser. In the context of a recent tendency toward thin-film chip, the resin, if excessively applied, runs off from a chip in a bonding process, moves up along the side surface of the chip and contaminates a bonding tool. Because of this, a tool washing step must be added, complicating a process at the time of a large-scale production.

Alternatively, in the case of bonding a resin film, it is easy to supply an optimum amount of resin by controlling the thickness of the resin; however, when the film is bonded to a board, a step of bonding the film called a provisional pressure-bonding step is required. In the provisional pressure-bonding step, a reel tape having slits at the intervals larger than the width of a target chip is used. The adhesive present on the base material of the reel tape is cut in half depending upon the size of the chip and bonded to the board by thermocompression bonding at such a temperature that an adhesive does not react.

Since the accuracy of supplying the film to a chip mounting position is low, generally a larger film than a chip size is bonded in the provisional pressure-bonding in order to keep yield. Accordingly, enough distance is required to an adjacent component, impeding high-density packaging. On the other hand, thin-width reel processing dealing with microchips, etc. is difficult. It is still necessary to bond a larger film than a chip size to deal with this case. An extra mounting area is required.

In the context, a method for supplying the same-size adhesive as a chip size is proposed. In this method, an adhesive is supplied in the stage of a wafer and then processed simultaneously with chips by dicing or the like to obtain chips attached with the adhesive (see, for example, Patent Documents 1, 2).

Patent Document 1: Japanese Patent No. 2833111
Patent Document 2: Japanese Patent Application Laid-Open No. 2006-049482

DISCLOSURE OF THE INVENTION

Problem to be Solved by the Invention

However, the preset underfill method on a wafer so far proposed has the following problems and not commonly used in the market. For example, in the method of Patent Document 1, an adhesive film is attached to a wafer and thereafter the wafer is diced into discrete pieces to obtain chips with the adhesive film.

According to this method, a wafer/adhesive/separator laminate is prepared and cut, and thereafter, the separator is peeled off to obtain chips attached with an adhesive. However, this method has a problem in that the adhesive and the separator are dissociated in cutting the laminate, with the result that discrete semiconductor chips scatter and run off.

Second, Patent Document 2 provides a method concerning a wafer processing tape having a sticky layer and an adhesive layer in which a wafer is bonded to a wafer processing tape and diced, and then, discrete chips picked up are connected to a board by flip-chip.

However, generally in flip-chip mounting, terminals called bumps formed on the circuit surface of a chip are connected to the corresponding terminals on a board. For this purpose, an alignment mark on the chip is aligned with an alignment mark on the board by a flip-chip bonder and then bonded. However, when an adhesive is applied on the circuit surface of a chip, the adhesive covers the alignment mark of the circuit surface, impeding alignment. This is a problem. However, Patent Document 2 does not provide any solution to deal with this problem.

On the other hand, a technique for obtaining transparency of a resin is described in the specification of Japanese Patent No. 3408301. That is an anisotropic conductive film containing conductive particles and transparent glass particles dispersed in an insulating adhesive and an adhesive. However, since the glass particles are amorphous and thus have a large linear expansion coefficient, it is thus difficult to attain a low linear expansion coefficient required as a property after the flip-chip mounting.

In the context, an object of the present invention is to provide a circuit-member connecting adhesive, which has excellent adhesiveness to a wafer in an unhardened state, through which an alignment mark provided to the wafer is highly recognizable, and has excellent adhesiveness and connection reliability between a chip and a board in a hardened state, and provide a semiconductor device using the same.

Means for Solving Problem

The present invention relates to the following items.

(1) An adhesive for connecting circuit members, which is interposed between a semiconductor chip having protruding connecting terminals and a board having wiring patterns formed thereon for electrically connecting the connecting terminals and the wiring patterns facing each other and bonding the semiconductor chip and the board by applying pressure/heat, in which
the adhesive for connecting circuit members contains
a resin composition comprising a thermoplastic resin, a crosslinkable resin and a hardening agent for forming a crosslink structure of the crosslinkable resin; and
composite oxide particles dispersed in the resin composition.

(2) The adhesive for connecting circuit members according to item (1), in which the refractive index difference between the resin composition and the composite oxide particles falls within ±0.06.

(3) The adhesive for connecting circuit members according to item (1) or (2), in which the composite oxide particles have a refractive index of 1.5 to 1.7 and are particles formed of a composite oxide comprising two or more types of metal elements.

(4) The adhesive for connecting circuit members according to any of items (1) to (3), in which the composite oxide particles are particles formed of at least one type of metal element selected from aluminum and magnesium, and an oxide comprising a metal element except the above metal elements or a metalloid element.

(5) The adhesive for connecting circuit members according to item (4), in which the metalloid element is silicon and/or boron.

(6) The adhesive for connecting circuit members according to any of items (1) to (5), in which the composite oxide particles are particles comprising a composite oxide having a specific gravity of 4 or less.

(7) An adhesive for connecting circuit members, which is interposed between a semiconductor chip having protruding connecting terminals and a board having wiring patterns formed thereon for electrically connecting the connecting terminals and the wiring patterns facing each other and bonding the semiconductor chip and the board by applying pressure/heat, in which
the adhesive for connecting circuit members contains
a resin composition containing a thermoplastic resin, a crosslinkable resin and a hardening agent for forming a crosslink structure of the crosslinkable resin; and
composite oxide particles comprising cordierite particles dispersed in the resin composition.

(8) The adhesive for connecting circuit members according to any of items (1) to (7), in which the composite oxide particles are composite oxide particles having an average particle size of 3 μm or less.

(9) The adhesive for connecting circuit members according to any of items (1) to (8), in which the composite oxide particles are comprised in an amount of 25 to 200 parts by weight relative to 100 parts by weight of the resin composition.

(10) The adhesive for connecting circuit members according to any of items (1) to (9), in which the adhesive for connecting circuit members in an unhardened state has a visible-light parallel transmittance of 15 to 100%.

(11) The adhesive for connecting circuit members according to any of items (1) to (10), in which a reactivity of the adhesive for connecting circuit members measured by a differential scanning calorimeter (DSC) after heating at 180° C. for 20 seconds is 80% or more.

(12) The adhesive for connecting circuit members according to any of items (1) to (11), in which a linear expansion coefficient of the adhesive for connecting circuit members measured at 40° C. to 100° C. after hardening is $70 \times 10^{-6}/°$ C. or less.

(13) The adhesive for connecting circuit members according to any of items (1) to (12), in which the thermoplastic resin is a copolymerizable resin having a weight average molecular weight of 1 million or less and a glass transition temperature (Tg) of 40° C. or less, and having a reactive functional group with the crosslinkable resin in a side chain,
the crosslinkable resin is an epoxy resin, and
the hardening agent is a microencapsulated hardening agent.

(14) The adhesive for connecting circuit members according to any of items (1) to (13), comprising conductive particles having an average particle size of 3 to 5 μm dispersed therein.

(15) A semiconductor device comprising an electronic component in which a semiconductor chip having connecting terminals and a board having wiring patterns formed thereon are electrically connected by the adhesive for connecting circuit members according to any of items (1) to (14).

Effect of the Invention

The present invention provides a circuit-member connecting adhesive, which has excellent adhesiveness to a wafer in an unhardened state, through which an alignment mark provided to the wafer is highly recognizable, and has excellent adhesiveness and connection reliability between a chip and a board in a hardened state, and provides a semiconductor device using the same. More specifically, there is provided a circuit-member connecting adhesive optimized for satisfying the following properties: compatibility between peel-off suppression during dicing and simple release after dicing by optimizing the adhesiveness to a wafer and the adhesiveness to a dicing tape; high elasticity of a film in an unhardened state in order to perform dicing while suppressing occurrence of fibrous burr and crack, etc.; visibility of an alignment mark through a resin, which enables accurate alignment of a diced adhesive chip with a circuit board; a high reactivity, which enables hardening at low temperature for short time in a chip mounting process; and a high connection reliability attained by lowering thermal expansion by a large content of filler. In addition, there is provided an anisotropic conductive adhesive wherein conductive particles are dispersed in the circuit-member connecting adhesive and a semiconductor device using these adhesives.

According to the circuit-member connecting adhesive of the present invention, a semiconductor chip attached with an adhesive can be obtained by a preset underfill method, which can deal with narrow-pitch and narrow-gap tendency, without contamination during a dicing process and without difficulty in peeling-off from a dicing tape after the dicing process. In addition, not only transparency, which enables accurate alignment of an adhesive chip but also high connection reliability obtained by lowering a thermal expansion coefficient can be obtained at the same time.

BRIEF DESCRIPTION OF THE DRAWINGS

FIG. 8(a) is a sectional view of a laminate formed by laminating a circuit-member connecting adhesive according to the first embodiment on a semiconductor chip; and FIG. 8(b) is a sectional view of the board;

FIG. 9(a) is a sectional view of a laminate formed by laminating a circuit-member connecting adhesive according to the second embodiment on a semiconductor chip and FIG. 9(b) is a sectional view of the board;

DESCRIPTION OF SYMBOLS

1 Circuit-member connecting adhesive according to the first embodiment; 2 Circuit-member connecting adhesive according to the second embodiment; 3 Semiconductor chip; 4 Board; 5 Electronic component mounting board; 10 Adhesive; 12 Conductive particles; 20 Semiconductor component; 22, 42 Connecting terminal; 30, 40 Insulating board; 32 Wiring pattern; 34 Solder ball

BEST MODES FOR CARRYING OUT THE INVENTION

Referring to the accompanying drawings, preferred embodiments will be described below. Note that identical symbols are used to designate the same structural elements in the description of the drawings and duplication of description is avoided. Furthermore, the figures are partly exaggerated in order to facilitate understanding and thus the dimensional ratios do not always coincide with those used in the description.

Figure 1:
FIG. 1 is a sectional view of a circuit-member connecting adhesive according to a first embodiment.
Figure 2:
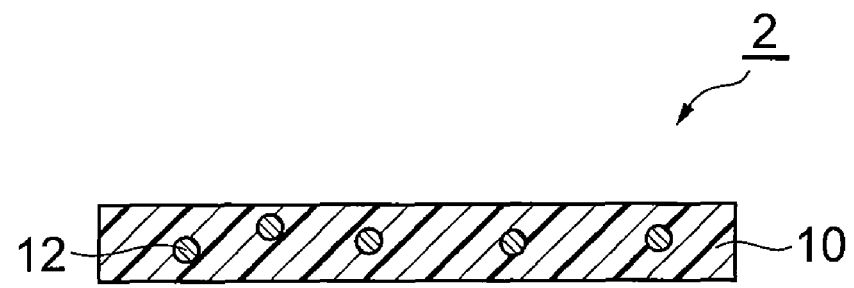
FIG. 2 is a sectional view of a circuit-member connecting adhesive according to a second embodiment.

FIG. 1 is a sectional view of a circuit-member connecting adhesive according to a first embodiment and FIG. 2 is a sectional view of a circuit-member connecting adhesive according to a second embodiment.

The circuit-member connecting adhesive 1 according to the first embodiment shown in FIG. 1 is a film adhesive constituted of an adhesive 10, which is formed of a resin composition comprising a thermoplastic resin, a crosslinkable resin and a hardening agent and composite oxide particles dispersed in the resin composition.

The circuit-member connecting adhesive 2 according to the second embodiment shown in FIG. 2 is a film adhesive constituted of the adhesive 10, which is formed of a resin composition comprising a thermoplastic resin, a crosslinkable resin and a hardening agent and composite oxide particles dispersed in the resin composition, and conductive particles 12 dispersed in the adhesive 10, which are 3 to 5 μm in average particle size.

Figure 3:
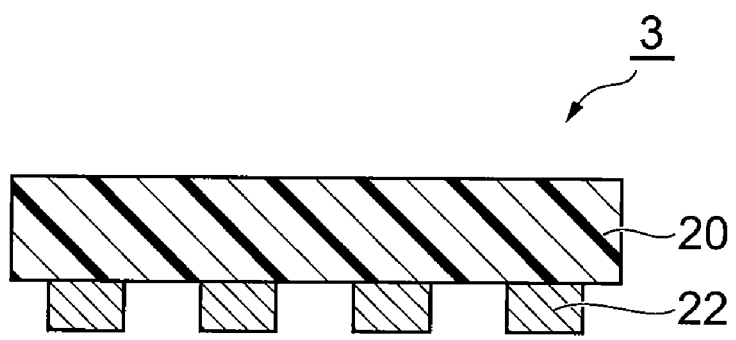
FIG. 3 is a sectional view of a semiconductor chip having protruding connecting terminals.

FIG. 3 is a sectional view of a semiconductor chip having protruding connecting terminals and to be joined by a circuit-member connecting adhesive of the present invention. The semiconductor chip 3 shown in FIG. 3 has a semiconductor component 20 and connecting terminals 22 formed so as to protrude on the main surface.

Figure 4:
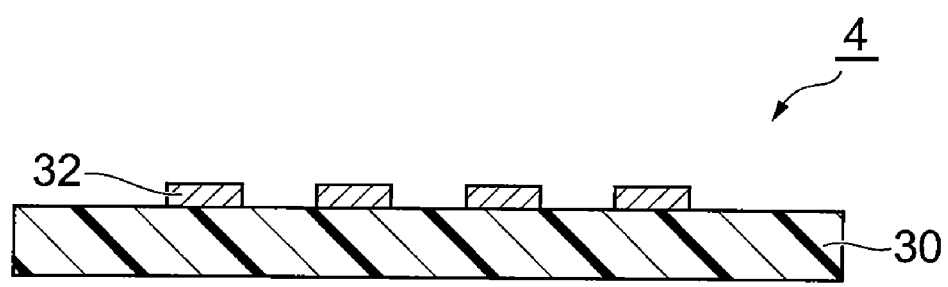
FIG. 4 is a sectional view of a board having wiring patterns formed thereon.

FIG. 4 is a sectional view of a board having wiring patterns formed thereon and to be joined by a circuit-member connecting adhesive of the present invention. The board 4 shown in FIG. 4 has an insulating board 30 and wiring patterns (electrode) 32 formed on the main surface.

Figure 5:
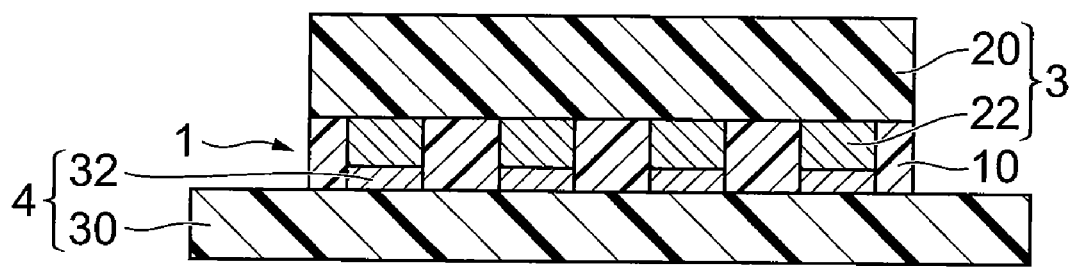
FIG. 5 is a sectional view of an electronic component in which a semiconductor chip and a board are electrically connected and bonded by a circuit-member connecting adhesive according to the first embodiment.

FIG. 5 is a sectional view of an electronic component in which a semiconductor chip and a board are electrically connected and bonded by a circuit-member connecting adhesive according to the first embodiment. In the electronic component shown in FIG. 5, a semiconductor chip 3, which has a semiconductor component 20 and connecting terminals 22, and the board 4, which has the insulating board 30 and the wiring patterns 32, are arranged such that the connecting terminals 22 and the wiring patterns 32 face each other. The semiconductor chip 3 and the board 4 are bonded by the circuit-member connecting adhesive 1 according to the first embodiment comprising the adhesive 10; at the same time, the connecting terminals 22 and the wiring patterns 32 are brought into contact with each other and electrically connected.

Figure 6:
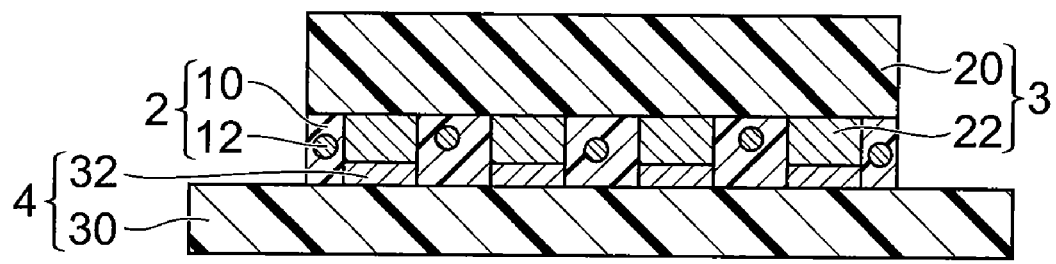
FIG. 6 is a sectional view of an electronic component in which a semiconductor chip and a board are electrically connected and bonded by a circuit-member connecting adhesive according to the second embodiment.

FIG. 6 is a sectional view of an electronic component in which a semiconductor chip and a board are electrically connected and bonded by a circuit-member connecting adhesive according to the second embodiment. In the electronic component shown in FIG. 6, a semiconductor chip 3, which has a semiconductor component 20 and a connecting terminal 22, and a board 4, which has an insulating board 30 and wiring patterns 32, are arranged such that the connecting terminals 22 and the wiring patterns 32 face each other. The semiconductor chip 3 and the board 4 are bonded by the circuit-member connecting adhesive 2 according to the second embodiment formed of the adhesive 10 and the conductive particles 12; at the same time, the connecting terminals 22 and the wiring patterns 32 are brought into contact with each other and electrically connected. Note that the conductive particles 12 are present at positions causing no short circuit between the connecting terminals 22 or between the wiring patterns 32.

Figure 7:
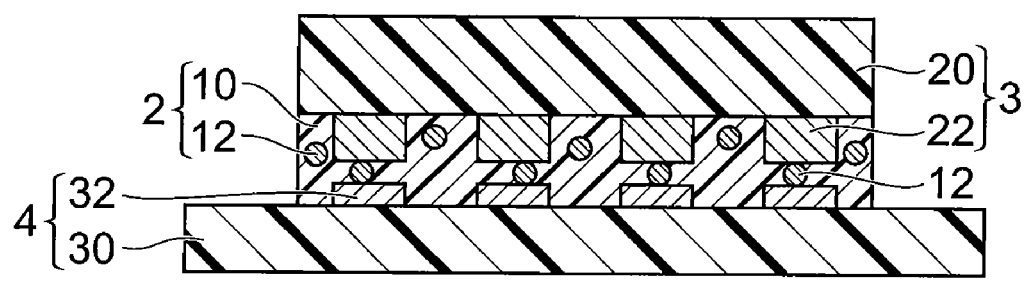
FIG. 7 is a sectional view of an electronic component in which a semiconductor chip and a board are electrically connected and bonded by a circuit-member connecting adhesive according to the second embodiment.

FIG. 7 is a sectional view of an electronic component in which a semiconductor chip and a board are electrically connected and bonded by a circuit-member connecting adhesive according to the second embodiment, and shows a different embodiment of the electronic component shown in FIG. 6. In the electronic component shown in FIG. 7, the semiconductor chip 3, which has a semiconductor component 20 and connecting terminals 22, and the board 4, which has an insulating board 30 and wiring patterns 32 are arranged such that the connecting terminals 22 and the wiring patterns 32 face each other. The semiconductor chip 3 and the board 4 are bonded by a circuit-member connecting adhesive according to the second embodiment comprising the adhesive 10 and the conductive particles 12; at the same time, the connecting terminals 22 and the wiring patterns 32 are brought into contact with each other with conductive particles 12 interposed between them, and electrically connected. Note that the conductive particles 12, which are not involved in electrical connection, are present at positions causing no short circuit between the connecting terminals 22 or the wiring patterns 32.

Figure 8:
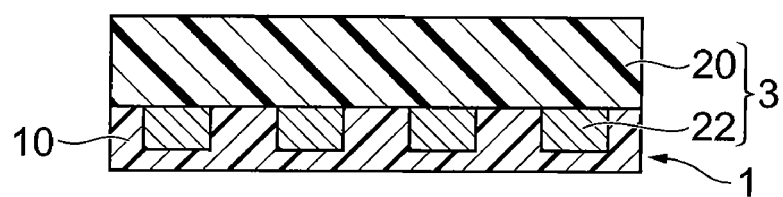
FIG. 8 is a sectional view illustrating an embodiment of a manufacturing step of the electronic component shown in FIG. 5.
Figure 8:
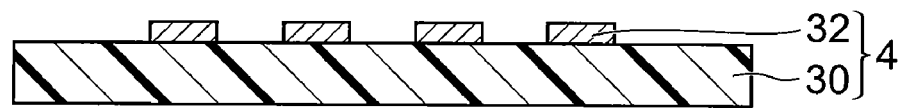

FIG. 8 is a sectional view illustrating an embodiment of a manufacturing step of the electronic component shown in FIG. 5. FIG. 8(a) is a sectional view of a laminate formed by laminating a circuit-member connecting adhesive according to the first embodiment comprising the adhesive 10 on a semiconductor chip 3, which has the semiconductor component 20 and the connecting terminals 22, on the side having the connecting terminals 22. FIG. 8(b) is a sectional view of the board 4 having the insulating board 30 and the wiring patterns 32. As shown in FIG. 8, the laminate of FIG. 8(a) and the board of FIG. 8(b) are subjected to pressure-bonding such that the connecting terminals 22 and the wiring patterns 32 face each other and the circuit-member connecting adhesive 1 is heated under pressure to obtain the electronic component shown in FIG. 5.

Figure 9:
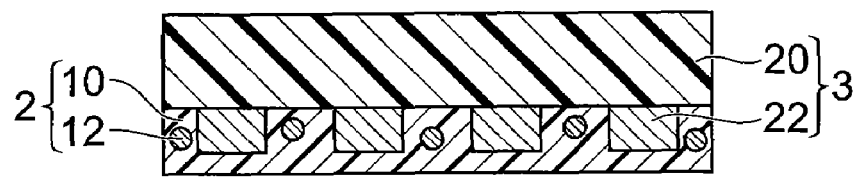
FIG. 9 is a sectional view illustrating an embodiment of a manufacturing step of the electronic component shown in FIG. 6 or 7.
Figure 9:
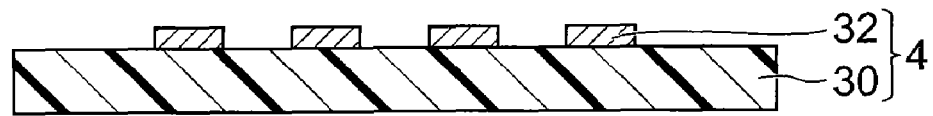

FIG. 9 is a sectional view illustrating an embodiment of a manufacturing step of the electronic component shown in FIG. 6 or 7. FIG. 9(a) is a sectional view of a laminate formed by laminating a circuit-member connecting adhesive 2 according to the second embodiment on a semiconductor chip, which comprising the adhesive 10 and the conductive particles 12, on a semiconductor chip 3, which has the semiconductor component 20 and the connecting terminals 22, on the side having the connecting terminals 22. FIG. 9(b) is a sectional view of the board 4 having the insulating board 30 and the wiring patterns 32. As shown in FIG. 9, the laminate of FIG. 9(a) and the board of FIG. 9(b) are subjected to pressure-bonding such that the connecting terminals 22 and the wiring patterns 32 face each other and the circuit-member connecting adhesive 2 is heated under pressure to obtain the electronic component shown in FIG. 6 or 7.

Figure 10:
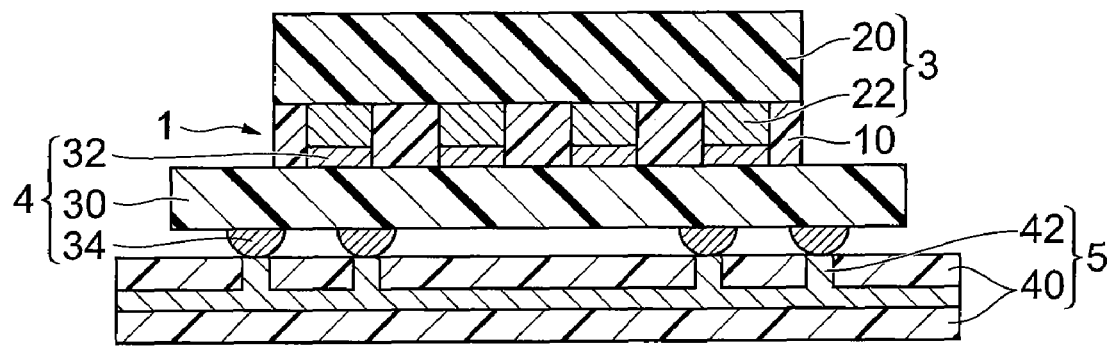
FIG. 10 is a sectional view of a semiconductor device having an electronic component in which a semiconductor chip and a board are electrically connected by a circuit-member connecting adhesive according to the first embodiment.

FIG. 10 is a sectional view of a semiconductor device having an electronic component in which a semiconductor chip is electrically connected to a board by a circuit-member connecting adhesive according to the first embodiment. The semiconductor device shown in FIG. 10 is composed of an electronic component and an electric component mounting board for mounting the electronic component. In the electronic component constituting the semiconductor device of FIG. 10, the semiconductor chip 3, which has the semiconductor component 20 and the connecting terminals 22, and the board 4, which has the wiring patterns 32 on one of the surfaces of the insulating board 30 and solder balls 34 on the other surface, are arranged such that the connecting terminals 22 and the wiring patterns 32 face each other. The semiconductor chip 3 and the board 4 are bonded by the circuit-member connecting adhesive 1 according to the first embodiment composed of the adhesive 10; at the same time, the connecting terminals 22 and the wiring patterns 32 are brought into contact with each other and electrically connected. Note that the wiring patterns 32 and the solder balls 34 are allowed to communicate by via holes (not shown) formed within the insulating board 30. In short, the semiconductor device shown in FIG. 10 is formed by electrically connecting the aforementioned electronic component and the electronic component mounting board 5, in which the connecting terminals 42 are formed on an insulating board 40, such that solder balls 34 are positioned on the connecting terminals 42 of the electronic component mounting board 5.

In the present invention, the connecting terminal 22 to be used in the semiconductor chip 3 is a gold stud bump formed of gold wire, a metal ball fixed to the electrode of the semiconductor chip by thermocompression bonding or by using a thermocompression bonding machine in combination with ultrasonic wave and a metal ball formed by plating or deposition.

The protruding connecting terminal 22 is not always formed of a single metal and may contain a plurality of metal components such as gold, silver, copper, nickel, indium, palladium, tin and bismuth, or may be a laminate of layers formed of these metals. The semiconductor chip 3 having the protruding connecting terminals 22 may be a semiconductor wafer having the protruding connecting terminals.

To arrange the protruding connecting terminals 22 of the semiconductor chip 3 and the board 4 having the wiring patterns 32 formed thereon so as to face each other, the semiconductor chip 3 preferably has an alignment mark in the same surface as that on which the protruding connecting terminals are formed. The circuit board to be used as the circuit board 4 having wiring patterns 32 formed thereon may be an ordinary circuit board or a semiconductor chip.

In the case of a circuit board, the wiring patterns 32 can be formed on an insulating board 30, which is formed by impregnating glass cloth or nonwoven cloth with an epoxy resin and a resin having a benzotriazine skeleton, and formed on a board having a build-up layer. The wiring patterns 32 can be also formed by forming a metal layer such as copper on the surface of an insulating board 30 formed of, e.g., polyimide, glass or ceramics and etching away an unnecessary portion of the metal layer. Alternatively, the wiring patterns can be formed by plating or depositing a metal on the surface of the insulating board 30.

The wiring patterns 32 are not always formed of a single metal and may contain a plurality of metal components such as gold, silver, copper, nickel, indium, palladium, tin and bismuth, or may be a laminate of layers of these metals. Furthermore, in the case where the board is a semiconductor chip, in which the wiring patterns 32 are usually formed of aluminum, a metal layer of gold, silver, copper, nickel, indium, palladium, tin and bismuth may be formed on the surface.

The state of a semiconductor chip where a circuit-member connecting adhesive is bonded on the surface having protruding connecting terminals can be obtained by forming a laminate by stacking a semiconductor wafer (before processed into chips) having protruding connecting terminals, the circuit-member connecting adhesive provided on the surface of the semiconductor wafer having protruding connecting terminals, and a dicing tape whose sticky layer is allowed to face the circuit-member connecting adhesive, sequentially in this order; and cutting the laminate into pieces by dicing; and removing the discrete semiconductor chips attached with the circuit-member connecting adhesive from the dicing tape. Alternatively, the state of a semiconductor chip where a circuit-member connecting adhesive is bonded on the surface having protruding connecting terminals can be also obtained by forming a laminate by providing a circuit-member connecting adhesive on the connecting terminal surface of a semiconductor wafer (before processed into chips) having protruding connecting terminals and providing a dicing tape such that a sticky layer thereof faces the surface of the semiconductor wafer having no circuit-member connecting adhesive; and cutting the laminate into pieces by dicing; and removing the discrete semiconductor chips attached with the circuit-member connecting adhesive from the dicing tape.

As the dicing tape having a sticky material applied to a base tape, a commercially available dicing tape can be used. As a radiation responsive dicing tape, whose stickiness decreases with UV irradiation since the sticky layer gradually hardened, thereby facilitating peel-off of a material laminated on the sticky surface, a commercially available one can be used.

The circuit-member connecting adhesive preferably has the feature that an alignment mark formed on the circuit surface of the chip can be recognized through the circuit-member connecting adhesive, which is bonded on the surface of a semiconductor chip having the protruding connecting terminals. The alignment mark can be recognized by a chip-recognition unit integrated in an ordinary flip-chip bonder.

The recognition unit is generally constituted of a halogen light source having a halogen lamp, a light guide, an irradiation apparatus and a CCD camera. The image is taken by the CCD camera, compared to the image pattern for use in alignment, which has been previously stored in the image processing unit, and determined whether both are consistent with each other. In this way, an alignment operation is performed.

The expression "an alignment mark can be recognized" herein means that the image of an alignment mark taken by the chip-recognition unit of the flip-chip bonder has good consistency with the image of the alignment mark stored therein and thus an alignment operation can be performed.

For example, when flip-chip bonder-CB-1050 (trade name, manufactured by Athlete FA Corporation) is used, a laminate, which has a circuit-member connecting adhesive bonded on the surface having protruding connecting terminals, is adsorbed by an adsorption nozzle of the flip-chip bonder at the opposite surface (having the protruding connecting terminals), and thereafter, a recognition mark formed on the semiconductor chip surface is photographed through the adhesive layer by a recognition unit integrated in the apparatus. In the case where the recognition mark photographed is consistent with the recognition mark of the semiconductor chip previously taken in the image processing apparatus, determining that alignment can be performed, the adhesive is treated as a recognizable circuit-member connecting adhesive. In contrast, in the case of determining that alignment cannot be performed, the adhesive is treated as a non-recognizable circuit-member connecting adhesive. In this manner, the adhesives can be selected.

The circuit-member connecting adhesive in a non-hardened state preferably has a parallel transmittance of 15 to 100%, more preferably 18 to 100% and further preferably 25 to 100%. When the parallel transmittance is less than 15%, a recognition mark cannot be recognized by the flip-chip bonder, with the result that alignment operation may not be performed.

The parallel transmittance can be measured by a turbidimeter NDH2000 (trade name, manufactured by Nippon Denshoku Industries Co., Ltd) based on integrating-sphere photoelectric photometry. To explain more specifically, a 50 µm-thick PET film manufactured by Teijin Dupont Films (Purex, transmittance of whole light beams: 90.45, haze: 4.47) is used as a reference substance. After correction is made, a circuit-member connecting adhesive is applied to a PET base to a thickness of 25 µm and subjected to measurement. From the measurement results, turbidity, whole light beam transmittance, diffusion transmittance and parallel transmittance can be obtained.

The visible-light transmittance can be measured by a U-3310 type spectrophotometer (trade name, manufactured by Hitachi Ltd.). To explain more specifically, a 50 µm-thick PET film manufactured by Teijin Dupont Films (Purex, 555 nm, transmittance: 86.03%) is used as a reference substance. After baseline correction measurement is made, a circuit-member connecting adhesive is applied to a PET base to a thickness of 25 µm. Then, a transmittance of visible light within the range of 400 nm to 800 nm can be measured. Since the relative intensity of a halogen light source used in the flip-chip bonder to that of the light guide is the strongest in the range of a wavelength of 550 nm to 600 nm, transmittance can be compared based on the transmittance at 555 nm in the present invention.

The circuit-member connecting adhesive preferably has a reactivity (measured by DSC after heated at 18020 C. for 20 seconds) is preferably of 80% or more, more preferably 84% or more, and further preferably 86% or more. Note that the reactivity can be measured, for example, by the following method. First, 2 to 10 mg of the circuit-member connecting adhesive before a reaction is weighed in an aluminum measurement container. Calorific value of the adhesive is measured by DSC while raising a temperature at a rate of 20° C./min from 30 to 300° C. to obtain an initial calorific value. Then, the circuit-member connecting adhesive is heated at 180° C. for 20 seconds by use of a heating head of a thermocompression bonding apparatus to obtain a heated circuit-member connecting adhesive. Then, 2 to 10 mg of the heated circuit-member connecting adhesive is taken and colorific value is measured by DSC in the same conditions as above to obtain a calorific value after heating. Based on the calorific values thus obtained, a reactivity (%) is calculated in accordance with the following formula:

$$(\text{Initial calorific value} - \text{calorific value after heating})/(\text{initial calorific value}) \times 100.$$

The circuit-member connecting adhesive preferably has an adhesive force of 10 N/m or less to a UV-irradiated dicing tape and an adhesive force of 70 N/m or more to a semiconductor wafer. When the adhesive force to a dicing tape after UV irradiation exceeds 10 N/m, the semiconductor chips may break and the adhesive layer may deform in a process where diced and separated semiconductor chips attached with the circuit-member connecting adhesive are peeled off from the dicing tape. On the other hand, when the adhesive force to a semiconductor wafer is less than 70 N/m, chips and the adhesive may separate at the interface by the effect of shock and hydraulic pressure given by rotary cleavage of a blade in a dicing process.

The adhesive force between the circuit-member connecting adhesive and the UV irradiated dicing tape can be measured, for example, by the following method. First, the circuit-member connecting adhesive is laminated on a wafer by a laminator set at a heating temperature of 80° C. The dicing tape before UV irradiation is laminated at 40° C. such that the sticky surface of the tape is brought into contact with the circuit-member connecting adhesive. Thereafter, UV rays (about 300 mJ at 15 mW) are applied to the dicing tape. Subsequently, slits are made in the UV irradiated dicing tape at width of 10 mm to prepare strips for tensile strength measurement.

Subsequently, the wafer is clamped on a stage and one end of the dicing-tape strip is fixed to a pulling jig of a tensile force measurement machine. The UV irradiated dicing tape and the circuit-member connecting adhesive are peeled off. In this manner, a 90° peel test is performed. Based on the measurement, the adhesive force between the UV irradiated dicing tape and the circuit-member connecting adhesive can be measured.

The adhesive force between the circuit-member connecting adhesive and the semiconductor wafer can be measured, for example, by the following method. First, the circuit-member connecting adhesive is laminated on the wafer by a laminator set at a heating temperature of 80° C. Thereafter, Kapton (registered trade mark) tape (manufactured by Nitto Denko Corporation, 10 mm in width, 25 μm in thickness) is bonded to the circuit-member connecting adhesive so as to face the sticky surface thereof and made tight sufficiently. After that, slits are made in the circuit-member connecting adhesive bonded to Kapton (registered trade mark) tape at width of 10 mm.

One end of the resultant laminate of the circuit-member connecting adhesive and Kapton (registered trade mark) tape is peeled off from the wafer and fixed to a pulling jig of a tensile force measurement machine. The wafer is clamped on a stage and one end of a strip is pulled up to peel off the circuit-member connecting adhesive from the wafer. In this manner, a 90° peel test is performed. Based on the measurement, the adhesive force between the circuit-member connecting adhesive and the wafer can be measured.

After bonding, the circuit-member connecting adhesive, in order to suppress temperature change and expansion due to heating and moisture adsorption, etc., after connecting between the semiconductor chip and a circuit board, preferably has a linear expansion coefficient (after hardening, measured at 40° C. to 100° C.) of $70 \times 10^{-6}$/° C. or less, more preferably $60 \times 10^{-6}$/° C. or less, further preferably $55 \times 10^{-6}$/° C. or less, and particularly preferably $50 \times 10^{-6}$/° C. or less. When the linear expansion coefficient (after hardening) exceeds $70 \times 10^{-6}$/° C., the electric contact between connecting terminals of a semiconductor chip and wiring of a circuit board may not be maintained due to temperature change and expansion by heating and moisture adsorption after mounting.

The circuit-member connecting adhesive contains an adhesive resin composition and composite oxide particles. The adhesive resin composition preferably has a parallel transmittance of 15% or more, more preferably 30% or more, and further preferably 40% or more. The case where the parallel transmittance is 40% or more is preferred since a predetermined transmittance can be satisfactorily obtained even if the content of composite oxide particles is high. When the parallel transmittance of the adhesive resin composition is less than 15% or less, a recognition mark cannot be recognized by a flip-chip bonder even if composite oxide particles are not added. As a result, an alignment operation may not be performed.

The composite oxide particles to be used in the present invention preferably have a refractive index of 1.5 to 1.7 and more preferably 1.53 to 1.65. If the refractive index of the composite oxide particles is less than 1.5, when the particles are blended in the adhesive resin composition, the refractive index difference from the resin composition becomes large. As a result, light is scattered when it passes through the circuit-member connecting adhesive and alignment may not be performed. On the other hand, if the refractive index exceeds 1.7, the refractive index difference from the resin increases, with the result that light is scattered and alignment may not be performed. The refractive index can be measured by Abbe refractometer using sodium D-line (589 nm) as a light source.

The composite oxide particles to be used in the present invention preferably have an average particle size of 15 μm or less and a maximum particle size of 40 μm or less, more preferably have an average particle size of 5 μm or less, and further preferably have an average particle size of 3 μm or less. The composite oxide particles are particles having an average particle size of 3 μm or less and a maximum particle size of 20 μm or less, and furthermore, particles particularly preferably having an average particle size of 3 μm or less and a maximum particle size of 5 μm or less. The case where the average particle size exceeds 15 μm is not preferred. This is because composite oxide particles enter between bumps (connecting terminals) of a chip and electrodes of a circuit board (a board having wiring patterns formed thereon). In particular, when mounting is performed under low pressure and when bumps are made of a hard substance such as nickel, embedding is not performed and electric contact is suppressed. In contrast, when the maximum particle size exceeds 40 μm, the particle size may exceed the gap between the chip and the board. Consequently, the particles may damage the circuit of the chip or the circuit of the board when pressure is applied during a mounting process.

The composite oxide particles to be used in the present invention preferably have a specific gravity of 4 or less, more preferably 2 to 4, and further preferably 2 to 3.2. If the specific gravity exceeds 4, when the particles are added to a varnish of an adhesive resin composition, they may precipitate in the vanish due to a large difference of specific gravity. As a result, the circuit-member connecting adhesive having composite oxide particles uniformly dispersed therein may not be obtained.

Furthermore, the composite oxide particles to be used in the present invention preferably have a refractive-index difference with the adhesive resin composition within ±0.06, more preferably within ±0.02, and further preferably within ±0.01. When the refractive-index difference exceeds ±0.06, the transmittance of the adhesive resin composition decreases by adding the particles. As a result, an alignment mark formed on the circuit surface of a chip cannot be recognized in some cases through the circuit-member connecting adhesive bonded on the surface of a semiconductor chip having the protruding connecting terminals thereon.

As such a composite oxide, one having a refractive index of 1.5 to 1.7 and a refractive-index difference with an adhesive resin composition within ±0.06 is particularly preferred. Examples of such a composite oxide include oxides containing metal elements such as zinc, aluminum, antimony, ytterbium, yttrium, indium, erbium, osmium, cadmium, calcium, potassium, silver, chrome, cobalt, samarium, dysprosium, zirconium, tin, cerium, tungsten, strontium, tantalum, titanium, iron, copper, sodium, niobium, nickel, vanadium, hafnium, palladium, barium, bismuth, praseodymium, beryllium, magnesium, manganese, molybdenum, europium, lanthanum, phosphorus, lutetium, ruthenium, rhodium and boron. They may be used in combination.

The composite oxide is preferably a compound containing not less than two types of metals as a raw material which has a different structure from an oxide structure formed of each of the raw material metals. Particularly preferably, the composite oxide particles are formed of at least one type of metal element selected from aluminum, magnesium or titanium and an oxide compound containing at least two types of elements except the aforementioned elements. As such a composite oxide, aluminum borate, cordierite, forsterite and mullite, etc may be mentioned. The composite oxide may be an aluminum composite oxide or a silicone composite oxide substituted with a metal element such as magnesium. Note that, in the present invention, a metalloid element (half-metal) such as silicon and boron is treated as a metal for forming a composite oxide.

The linear expansion coefficient of the composite oxide particles is preferably $7 \times 10^{-6}$/°C. in the temperature range of 0 to 700° C. or less, and more preferably $3 \times 10^{-6}$/°C. or less. When the linear expansion coefficient exceeds $7 \times 10^{-6}$/°C., a large amount of composite oxide particles must be added in order to reduce the linear expansion coefficient of the circuit-member connecting adhesive.

As the composite oxide particles, cordierite is further preferable since fine adjustment of the refractive index can be made and the linear expansion coefficient is low. Cordierite is a compound represented by a general composition of $MgO/Al_2O_3/SiO_2$ and has a refractive index of 1.54. The ratio of $MgO/Al_2O_3/SiO_2$ is 2/2/5. Fine adjustment of the refractive index can be made by slightly changing the ratio. The linear expansion coefficient of a crystallized compound is $2 \times 10^{-6}$/°C. or less. The composite oxide particles contained in the circuit-member connecting adhesive preferably contain cordierite particles. The composite oxide particles may contain cordierite particles alone or may contain composite oxide particles other than cordierite particles. In the latter case, the content of the cordierite particles is preferably 50 wt % or more based on the total amount of the composite oxide particles, more preferably 70 wt % or more, and further preferably 90 wt % or more.

In the circuit-member connecting adhesive, the content of the composite oxide particles is preferably 25 to 200 parts by weight relative to 100 parts by weight of a resin composition. The content is more preferably 25 to 150 parts by weight, further preferably 50 to 150 parts by weight, and particularly preferably 75 to 125 parts by weight. When the content of the composite oxide particles is less than 25 parts by weight, the linear expansion coefficient of the circuit-member connecting adhesive may increase and the elastic modulus may decrease. In such a case, connection reliability between a semiconductor chip and a board after pressure-bonding decreases. On the other hand, when the content of the composite oxide particles exceeds 200 parts by weight, the melt viscosity of the circuit-member connecting adhesive increases, with the result that sufficient contact between protruding electrodes of a semiconductor to the circuit of a board may become difficult.

The circuit-member connecting adhesive contains a resin composition and composite oxide particles dispersed in the resin composition. The resin composition contains a thermoplastic resin, a crosslinkable resin and a hardening agent capable of forming a crosslink structure of this resin. The resin composition or circuit-member connecting adhesive may contain other additives (a filler, a plasticizer, a coloring agent, a crosslinking auxiliary, etc.) as long as the effect of the present invention is not inhibited. Note that the resin composition may consist only of a thermoplastic resin, a crosslinkable resin and a hardening agent capable of forming a crosslink structure of this resin. The circuit-member connecting adhesive may consist only of the resin composition and composite oxide particles dispersed in the resin composition.

As the thermoplastic resin contained in the resin composition, mention may be made of a polyolefin (such as polyethylene, polypropylene), an ethylene copolymer (such as an ethylene-α olefin copolymer, an ethylene-vinyl acetate copolymer, an ethylene-(meth)acrylate copolymer), a styrene block copolymer, an acrylic polymer (which refers to a polymer of monomers having a (meth)acryloyl group), an acrylic copolymer (which refers to a copolymer containing a monomer having a (meth)acryloyl group as a co-monomer) and a phenoxy resin. An acrylic polymer and acrylic copolymer or a phenoxy resin is preferred. The thermoplastic resin preferably has a weight average molecular weight of 1 million or less, more preferably 0.5 millions or less, and further preferably 0.3 millions or less. Furthermore, the Tg of the thermoplastic resin is preferably 40° C. or less, and more preferably 35° C. or less.

The crosslinkable resin contained in the resin composition is a resin (three-dimensional crosslinking resin) forming a three dimensional crosslink by the action of the hardening agent used in combination with energy application such as heat/light irradiation, and preferably a resin having a functional group reactive to the hardening agent with application of heat and light. As such a crosslinkable resin, mention may be made of an epoxy resin, a bismaleimide resin, a triazine resin, a polyimide resin, a polyamide resin, a cyanoacrylate resin, a phenolic resin, an unsaturated polyester resin, a melamine resin, a urea resin, a polyurethane resin, a polyisocyanate resin, a furan resin, a resorcinol resin, a xylene resin, a benzoguanamine resin, a diallyl phthalate resin, a silicone resin, a polyvinylbutyral resin, a siloxane-modified epoxy resin, a siloxane-modified polyamide-imide resin and an acrylate resin, etc. They may be used singly or as a mixture of two types or more.

The hardening agent which acts on such a crosslinkable resin to form a crosslinking structure can be determined in accordance with the reactivity (e.g., type of a functional group) of the crosslinkable resin. As the hardening agent, mention may be made of hardening agents of a phenolic base, imidazole base, hydrazide base, thiol base, benzoxazine, a boron trifluoride-amine complex, a sulfonium salt, amine-imide, a polyamine salt, dicyandiamide and an organic peroxide base. These hardening agents may be microcapsules having a coat of a polymer substance such as a polyurethane polymer and a polyester polymer to extend its work life.

The thermoplastic resin is preferably a co-polymerizable resin having a weight average molecular weight of 1 million or less (preferably 0.5 millions or less, and further preferably 0.3 millions or less) and a Tg of 40° C. or less (preferably 35° C. or less) and containing at least one functional group reactive to a crosslinkable resin in a side chain. As a hardening agent, a microencapsulated hardening agent is preferred. It is particularly preferred that such a copolymerizable resin may be used in combination with the microencapsulated hardening agent. Note that Tg (glass transition temperature) can be measured by the DSC method specified by JIS K7121 "plastic transition temperature measurement method".

As the copolymerizable resin having a weight average molecular weight of 1 million or less and a Tg of 40° C. or less and containing at least one functional group reactive to a crosslinkable resin in a side chain, it is preferred to use acrylic copolymers containing an epoxy group, a carboxyl group and a hydroxyl group in a side chain as the functional group reactive to a crosslinkable resin. Particularly, an epoxy group-containing acrylic copolymer is preferred, which is obtained by using e.g., glycidyl acrylate or glycidyl methacrylate as a raw material for an acrylic copolymer.

As a raw material for use in copolymerization of the copolymerizable resin, use may be made of hydroxy alkyl (meth)acrylates such as hydroxyethyl (meth)acrylate, hydroxypropyl (meth)acrylate and hydroxybutyl (meth)acrylate; (meth)acrylic esters such as methyl methacrylate, butyl (meth)acrylate, 2-ethylhexyl (meth)acrylate, cyclohexyl (meth)acrylate, furfuryl (meth)acrylate, lauryl (meth)acrylate, stearyl (meth)acrylate, trimethylcyclohexyl (meth)acrylate, tricyclodecyl (meth)acrylate, and tetracyclododecyl-3-acrylate; styrene, vinyl toluene, polypropylene glycol monomethacrylate, hydroxyethyl acrylate, acrylonitrile, benzyl methacrylate, cyclohexylmaleimide and the like.

The microencapsulated hardening agent is referred to one containing a hardening agent serving as a core, which is substantially coated with a film such as a thin film made of a polymer substance such as polyurethane, polystyrene, gelatin or polyisocyanate; an inorganic substance such as calcium silicate or zeolite; and a metal such as nickel or copper. The average particle size of the microencapsulated hardening agent is preferably 10 µm or less, and more preferably 5 µm or less.

The resin composition may contain a microencapsulated hardening agent or a non-microencapsulated hardening agent. The resin composition may also contain a coupling agent in order to increase adhesion intensity and a thermoplastic resin such as polyester, polyurethane, polyvinyl butyral, a polyarylate, polymethyl methacrylate, acrylic rubber, polystyrene, phenoxy resin, NBR, SBR, polyimide and a silicone-modified resin (acrylic silicone, epoxy silicone, polyimide silicone) to contribute to film formability. Furthermore, to modify the surface of composite oxide particles, silicone oil, polysiloxane, a silicone oligomer and a coupling agent may be contained.

The circuit-member connecting adhesive can be an anisotropic conductive adhesive which is prepared by adding conductive particles having a particle size of 3 to 5 µm and coated with an organic polymer compound and/or metal conductive particles. As the conductive particles before coated with an organic polymer compound, metal particles of Au, Ag, Ni, Cu and solder and carbon particles may be used. To obtain a sufficient pot life, the surface of the particles may not be made of a transition metal such as Ni or Cu and preferably made of a precious metal such as Au, Ag or platinum, and more preferably Au.

Furthermore, the surface of a transition metal such as Ni may be coated with a precious metal such as Au. Moreover, particles, which are formed by coating a non-conductive glass, ceramic and plastic, etc. with a conductive layer as mentioned above and adding a precious metal as the outermost layer, and thermofusion metal particles are preferred. This is because they deform when heat or pressure is applied and cancel out variation in height of electrodes to increase the contact area with the electrodes when connected, thereby improving reliability. The thickness of the precious-metal coating layer is preferably 100 angstroms or more in order to obtain good resistance.

However, when a precious-metal layer is formed on a transition metal such as Ni, if there is a defect of the precious metal layer; i.e., a defect of the precious metal layer produced in mixing and dispersing conductive particles, an oxidation-reduction reaction occurs. Consequently, free radicals are generated and decrease storageability. Therefore, the thickness of the precious metal layer is preferred to be 300 angstroms or more. As the thickness increases, the aforementioned effects come to be saturated. For the reason, the thickness is, but not particularly limited to, desirably at most 1 µm. The surface of the conductive particles is coated with an organic polymer compound as needed.

The organic polymer compound to be used for coating is preferably water soluble because coating operation can be easily performed. As the water soluble polymer, mention may be made of polysaccharides such as alginic acid, pectic acid, carboxymethylcellulose, agar, curdlan and pullulan; polycarboxylic acids such as polyaspartic acid, polyglutaminic acid, polylysine, polymalic acid, polymethacrylic acid, ammonium polymethacrylate, sodium polymethacrylate, polyamic acid, polymaleic acid, polyitaconic acid, polyfumaric acid, poly(p-styrene carboxylic acid), polyacrylic acid, polyacrylamide, methyl polyacrylate, ethyl polyacrylate, ammonium polyacrylate, sodium polyacrylate, polyamic acid, ammonium polyamidate, sodium polyamidate and polyglyoxylic acid; polycarboxylic ester and salts thereof; and vinyl monomers such as polyvinyl alcohol, polyvinyl pyrrolidone and polyacrolein. These compounds may be used singly or in combination of two types or more.

The thickness of the coating is preferably 1 µm or less. Since conductive particles are electrically connected with connecting terminals by eliminating the coating. Therefore, the part of the coating in contact with the connecting terminals must be eliminated in a heating and pressurizing process. The content of the conductive particles may be varied depending upon the use within the range of 0.1 to 30 parts by volume relative to 100 parts by volume of the adhesive resin component. To prevent a problem such as short circuit to an adjacent circuit by excessive conductive particles, the content of the conductive particles is more preferably 0.1 to 10 parts by volume.

A laminate, which is formed of a semiconductor wafer having protruding connecting terminals, the circuit-member connecting adhesive (or circuit-member connecting anisotropic conductive adhesive) and a dicing tape that is to be hardened by UV irradiation, can be also obtained by laminating the semiconductor wafer and the circuit-member connecting adhesive by an apparatus having a heating mechanism and a pressurizing roller or an apparatus having a heating mechanism or a vacuum press mechanism and thereafter, further laminating with the dicing tape by an apparatus such as a wafer mounter.

Furthermore, the laminate, which is formed of a semiconductor wafer having protruding connecting terminals, the circuit-member connecting adhesive (or circuit-member connecting anisotropic conductive adhesive) and a dicing tape that is to be hardened by UV irradiation, can be also obtained by laminating the circuit-member connecting adhesive and the dicing tape to prepare a laminate, that is then laminated on the semiconductor wafer by a wafer mounter having a heating mechanism and a pressurizing roller or a wafer mounter having a heating mechanism or a vacuum press mechanism.

Laminating of a semiconductor wafer and a circuit-member connecting adhesive or laminating a laminate of a semiconductor wafer and a circuit-member connecting adhesive is preferably performed at a temperature at which the circuit-member connecting adhesive is softened, for example, preferably performed while heating to 40 to 80° C., more preferably while heating to 60 to 80° C., further preferably while heating to 70 to 80° C.

When laminating is performed at less than a softening temperature of the circuit-member connecting adhesive, the protruding connecting terminals of a semiconductor wafer are not sufficiently embedded in the peripheral portion and voids are involved, which may cause peel-off in a dicing process, distortion of the circuit-member connecting adhesive during a pick-up process, invisibility of a recognition mark during an alignment process. Furthermore, connection reliability may decrease due to the voids.

When a laminate, which is formed of a semiconductor wafer, a circuit-member connecting adhesive and a dicing tape, are diced, a scribe line can be aligned by use of an IR recognition camera by recognizing an alignment mark on a circuit pattern of the semiconductor wafer or an alignment mark for dicing through the wafer.

In a laminate, which is formed of a semiconductor wafer, a circuit-member connecting adhesive and a dicing tape, a step of cutting the semiconductor wafer and the circuit-member connecting adhesive can be performed by a dicer usually used. The cutting by the dicer is performed in accordance with a step generally called as dicing.

Dicing may be preferably performed stepwise. In the first step, a wafer alone is cut. In the second step, the wafer remaining in the cut groove of the first step and the circuit-member connecting adhesive are preferably cut until the interface with the dicing tape or partly within the dicing tape.

A laminate, which is formed of a semiconductor wafer, a circuit-member connecting adhesive and a dicing tape, can be diced by a laser. In the UV irradiation step after dicing, UV irradiation (about 150 to 300 mJ) can be applied to the dicing tape by a general light-exposure apparatus or the like at 15 to 30 mW.

The dicing tape and the adhesive are separated by pushing the dicing tape toward the semiconductor wafer to obtain diced (discrete) semiconductor chips attached with an adhesive. This step can be carried out by an apparatus capable of picking up the chips from the wafer. The dicing tape is pressed from the opposite surface of the tape on which semiconductor chips are mounted so as to extend by pressure. In this way, the circuit-member connecting adhesive and the UV irradiated dicing tape are peeled off by being separated at the interface thereof.

An adsorption step, an alignment step and a heating/pressurizing step of adhesive chips can be carried out by a general flip-chip bonder. Alternatively, the adsorption step and the alignment step are carried out, and the semiconductor chips aligned are provisionally fixed on a board and the heating/pressurizing step may be performed by a pressure-bonding apparatus (exclusively performing pressure-bonding) to make a connection. Furthermore, connection can be made not only by applying heat and pressure but also while applying ultrasonic wave.

EXAMPLES

The present invention will be more specifically described below by way of Examples; however, the present invention is not limited to these Examples.

Example 1

As a crosslinkable resin, an epoxy resin NC 7000 (trade name, manufactured by Nippon Kayaku Co., Ltd.): 15 parts by weight, was used. As a hardening agent reacting with the crosslinkable resin, phenol-aralkyl resin XLC-LL (trade name, manufactured by Mitsui Chemicals Inc.): 15 parts by weight, was used. As a copolymerizable resin having a molecular weight of 1 million or less and a Tg of 40° C. or less and containing at least one functional group reactive to the crosslinkable resin in a side chain, an epoxy group-containing acrylic rubber HTR-860P-3 (trade name, manufactured by Nagase ChemteX Corporation, the weight average molecular weight: 0.3 million): 20 parts by weight, was used. As microencapsulated hardening agent, HX-3941HP (trade name, manufactured by Asahi Kasei Corporation): 50 parts by weight and a silane coupling agent SH6040 (trade name, manufactured by Toray Dow Corning Silicone, Co., Ltd.) were used. The aforementioned substances were dissolved in a toluene/ethyl acetate solvent mixture in accordance with the composition listed in Table 1 to obtain a varnish of an adhesive resin composition.

Part of the varnish was applied onto a separator film (PET film) by a roll coater, and the dried in an oven of 70° C. for 10 minutes to obtain a 25 μm-thick adhesive resin composition on the separator. The film was placed on a sample stage of Abbe refractometer (sodium D line). After the separator was peeled off, a single droplet of matching oil was dropped and a test piece having a refractive index of 1.74 was placed. Then, a refractive index was measured. As a result, the refractive index of the adhesive resin composition was 1.59 (25° C.).

Figure 11:
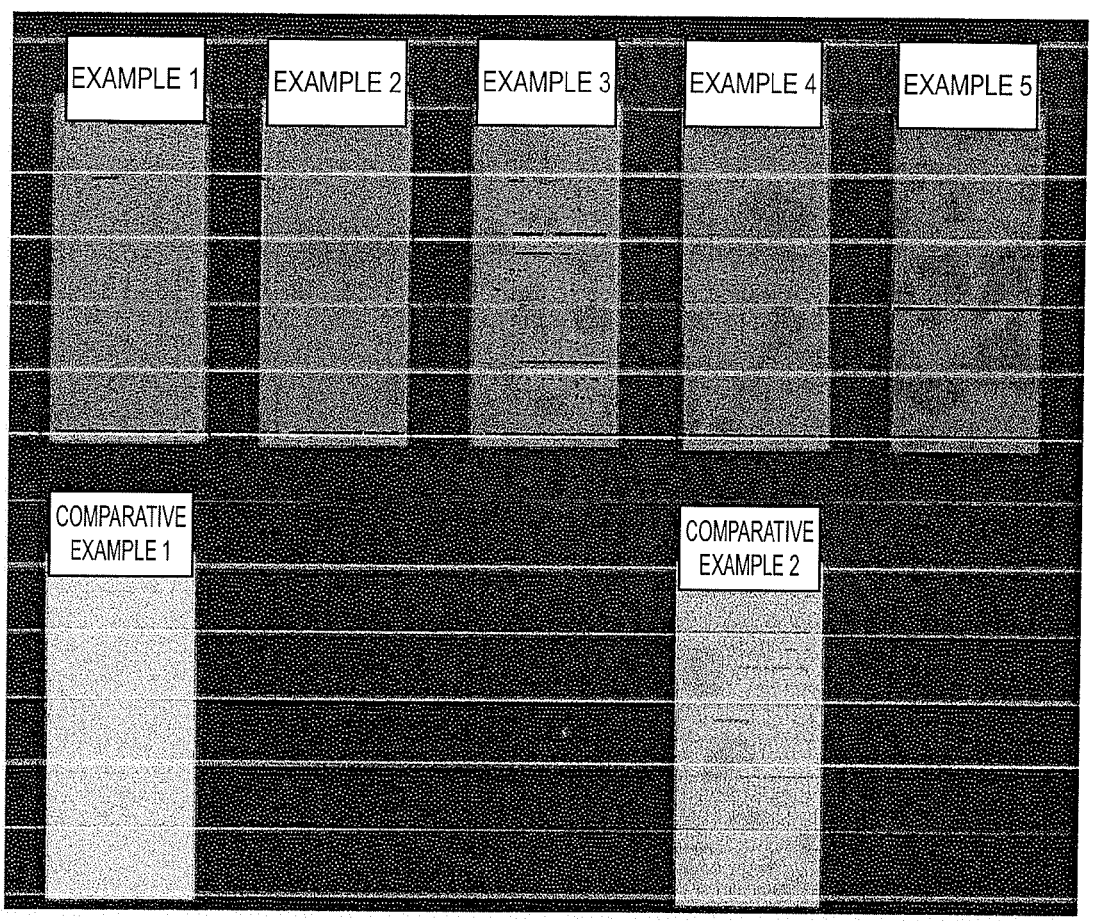
FIG. 11 is a view showing transmissivity of adhesives for connecting circuit members.

On the other hand, to the varnish, cordierite particles of 1 μm in average particle size ($2MgO \cdot 2Al_2O_3 \cdot 5SiO_2$, specific gravity: 2.4, linear expansion coefficient: $1.5 \times 10^{-6}$/° C., refractive index: 1.54), which were weighed, pulverized and subjected to 5 μm-classification to remove large particles, were mixed in accordance with the composition listed in Table 1 and stirred to disperse. Thereafter, the varnish was applied onto a separator film (PET film) by use of a roll coater and then dried in an oven of 70° C. for 10 minutes to obtain a 25 μm-thick transparency confirmation film on the separator. As shown in FIG. 11, an image on the rear side of the obtained transparency confirmation film was recognized through the film.

Aside from the above, to the varnish, cordierite particles of 1 μm in average particle size ($2MgO \cdot 2Al_2O_3 \cdot 5SiO_2$, specific gravity: 2.4, linear expansion coefficient: $1.5 \times 10^{-6}$/° C., refractive index: 1.54), which were weighed, pulverized and subjected to 5 μm-classification to remove large particles, were mixed in accordance with the composition listed in Table 1 and stirred to disperse. Thereafter, the varnish was applied onto a separator film (PET film) by use of a roll coater and then dried in an oven of 70° C. for 10 minutes to obtain a 20 μm-thick insulating adhesive layer of a circuit-member connecting adhesive on the separator.

Examples 2 to 4

Varnishes of adhesive resin compositions were prepared in accordance with the compositions listed in Table 1 in the same manner as in Example 1 and through the same steps as in Example 1, and thereafter transparency confirmation films were prepared and simultaneously insulating adhesive layers of circuit-member connecting adhesives were obtained.

Example 5

A varnish of adhesive resin composition was prepared in accordance with the composition listed in Table 1 in the same manner as in Example 1 and through the same steps as in Example 1. A transparency confirmation film was prepared through the same steps as in Example 1 except that aluminum borate ($9Al_2O_3 \cdot 2B_2O_3$, manufactured by Shikoku Chemicals Corporation, specific gravity: 3.0, linear expansion coefficient: $2.6 \times^{-6}$/° C., refractive index: 1.62) was used, and simultaneously an insulating adhesive layer of a circuit-member connecting adhesive.

Example 6

A varnish of adhesive resin composition containing cordierite particles was prepared in accordance with the composition listed in Table 1 in the same manner as in Example 1 and through the same steps as in Example 1 to obtain a 45 μm-thick circuit-member connecting adhesive on a separator film.

Subsequently, a chip (10 mm square, 280 μm in thickness) with 184 gold wire bumps (leveled, 30 μm in height) was placed on a stage of a provisional pressure-bonding apparatus with the bump-surface facing up. The circuit-member connecting adhesive attached with a separator were cut into 12 mm-square pieces and placed over the chip such that the adhesive faces the bump-surface. Furthermore, a heat-conductive cover film made of silicon was placed thereon and bonded to the chip at 80° C. and 1 MPa.

After adhesion, the resin running off the outer edge of the chip was cut. The separator was peeled off from the adhesive to obtain a chip with the adhesive. When the chip with the adhesive was observed by a recognition camera of a flip-chip bonder, an alignment mark on the circuit surface of the chip was successfully recognized.

Alignment with a Ni/Au plated Cu printed circuit board was performed. Subsequently, heating and pressurization were performed at 180° C. and 0.98 N/bump for 20 seconds to obtain a semiconductor device. The connection resistance of the obtained semiconductor device (176 bump connecting daisy chain) was 8.6 Ω. It was confirmed that good connection state was obtained.

Furthermore, the semiconductor device was allowed to stand alone in a vessel set at 30° C. and a relative humidity of 60% for 192 hours. Thereafter, an IR reflow treatment (maximum temperature: 265° C.) was repeated three times. No peel-off of chips and conduction failure were observed.

After the IR reflow treatment, the semiconductor device was further allowed to stand alone in a temperature cycle tester (−55° C. for 30 minutes, room temperature for 5 minutes and 125° C. for 30 minutes). Connection resistance was measured in the vessel. It was confirmed that no conduction failure occurs after 600 cycles.

Example 7

As a crosslinkable resin, epoxy resin EP1032H60 (trade name, manufactured by Japan Epoxy Resins Co., Ltd.) and a phenoxy resin YP50S (trade name, manufactured by Tohto Kasei Co., Ltd.,) having a weight average molecular weight of 70000 were used. As a microencapsulated hardening agent, HX-3941HP (trade name, manufactured by Asahi Kasei Corporation) and a silane coupling agent SH6040 (trade name, manufactured by Toray Dow Corning Silicone, Co., Ltd.) were used. These substances were mixed in accordance with the composition listed in Table 1 and dissolved in a toluene/ethyl acetate solvent mixture to obtain a varnish of an adhesive resin composition.

To the varnish, 50 parts by weight of cordierite particles of 1 μm in average particle size (2MgO·2Al$_2$O$_3$·5SiO$_2$, specific gravity: 2.4, linear expansion coefficient: $1.5 \times 10^{-6}$/° C., refractive index: 1.54), which were pulverized and subjected to 5 μm-classification to remove large particles, were mixed and stirred to disperse. Thereafter, the varnish was applied onto a separator film (PET film) by use of a roll coater, and then dried in an oven of 70° C. for 10 minutes to obtain a 45 μm-thick circuit-member connecting adhesive.

Subsequently, the adhesive was bonded to a chip attached with gold wire bumps in the same manner as in Example 6 and then connected to Au/Ni plated Cu printed circuit board to obtain a semiconductor device. The connection resistance of the obtained semiconductor device (176 bump connecting daisy chain) was 8.6 Ω. It was confirmed that good connection state was obtained.

Furthermore, the semiconductor device was allowed to stand alone in a vessel set at 30° C. and a relative humidity of 60% for 192 hours. Thereafter, an IR reflow treatment (maximum temperature: 265° C.) was repeated three times. No peel-off of chips and conduction failure were observed.

After the IR reflow treatment, the semiconductor was allowed to stand alone in a temperature cycle tester (−55° C. for 30 minutes, room temperature for 5 minutes and 125° C. for 30 minutes). Connection resistance was measured in the vessel. It was confirmed that no conduction failure occurs after 600 cycles.

TABLE 1

| Trade name or material name | Example | | | | | | |
|---|---|---|---|---|---|---|---|
| | 1 | 2 | 3 | 4 | 5 | 6 | 7 |
| NC7000 | 15 | 15 | 15 | 15 | 15 | 15 | — |
| EP1032H60 | — | — | — | — | — | — | 20 |
| XLC-LL | 15 | 15 | 15 | 15 | 15 | 15 | — |
| HTR-860P-3 | 20 | 20 | 20 | 20 | 20 | 20 | — |
| YP50S | — | — | — | — | — | — | 35 |
| HX-3941HP | 50 | 50 | 50 | 50 | 50 | 50 | 45 |
| SH6040 | 1 | 1 | 1 | 1 | 1 | 1 | 1 |
| Cordierite | 100 | 75 | 50 | 25 | — | 50 | 50 |
| Aluminum borate | — | — | — | — | 50 | — | — |

(Unit: part by weight)

Example 8

Transparency confirmation film having a composition listed in Table 2 was prepared in the same procedures as mentioned above except that conductive particles of 3 μm in average particle size, which were formed by providing a 0.2 μm-thick nickel layer on the surface of particles having a polystyrene core and providing a 0.04 μm thick gold layer outside the nickel layer, were further mixed with the insulating adhesive layer obtained in Example 1, and a 5 μm-thick particle layer for a circuit-member connecting adhesive was obtained on the separator. The insulating adhesive layer and the particle layer were bonded by a laminator to obtain a 25 μm-thick circuit-member connecting anisotropic conductive adhesive.

Examples 9 to 11

The same steps as in Example 8 were repeated except that, to the insulating adhesive layers obtained in Examples 2 to 4, further a 0.2 μm-thick nickel layer was provided on the surface of particles having a polystyrene core. As a result, a 25 μm-thick circuit-member connecting anisotropic conductive adhesives were obtained.

Example 12

The same steps as in Example 8 were repeated except that, to the insulating adhesive layers obtained in Example 5, a 0.2 μm-thick nickel layer was provided on the surface of particles having a polystyrene core. As a result, a 25 μm-thick circuit-member connecting anisotropic conductive adhesive was obtained.

TABLE 2

| Trade name or material name | Example | | | | |
|---|---|---|---|---|---|
| | 8 | 9 | 10 | 11 | 12 |
| NC7000 | 15 | 15 | 15 | 15 | 15 |
| EP1032H60 | — | — | — | — | — |
| XLC-LL | 15 | 15 | 15 | 15 | 15 |
| HTR-860P-3 | 20 | 20 | 20 | 20 | 20 |
| YP50S | — | — | — | — | — |
| HX-3941HP | 50 | 50 | 50 | 50 | 50 |

TABLE 2-continued

| Trade name or material name | Example | | | | |
|---|---|---|---|---|---|
| | 8 | 9 | 10 | 11 | 12 |
| SH6040 | 1 | 1 | 1 | 1 | 1 |
| Cordierite | 100 | 75 | 50 | 25 | — |
| Aluminum borate | — | — | — | — | 50 |
| Conductive particles | 5 vol % | 5 vol % | 5 vol % | 5 vol % | 5 vol % |

(Unit: part by weight)

Comparative Example 1

As a crosslinkable resin, an epoxy resin NC7000 (trade name, manufactured by Nippon Kayaku Co., Ltd.) was used. As a hardening agent reacting with the crosslinkable resin, phenol-aralkyl resin XLC-LL (trade name, manufactured by Mitsui Chemicals Inc.) was used. As a copolymerizable resin having a molecular weight of 1 million or less and a Tg of 40° C. or less and containing at least one functional group reactive to the crosslinkable resin in a side chain, an epoxy-group containing acrylic rubber HTR-860-3 (trade name, manufactured by Nagase ChemteX Corporation, weight average molecular weight: 0.3 million) was used. As microencapsulated hardening agent, HX-3941HP (trade name, manufactured by Asahi Kasei Corporation) and a silane coupling agent SH6040 (trade name, manufactured by Toray Dow Corning Silicone, Co., Ltd.) were used. The aforementioned substances were dissolved in a toluene/ethyl acetate solvent mixture in accordance with the composition listed in Table 3 to obtain a varnish of an adhesive resin composition.

To the varnish, silica particles SE2050 of 0.5 μm in average particle size (trade name, manufactured by Admatechs Co., Ltd., specific gravity: 2.22, linear expansion coefficient: 5×10$^{-7}$/° C., refractive index: 1.46), which were subjected to 5 μm-classification to remove large particles, were mixed in accordance with the composition listed in Table 3 and stirred to disperse. Thereafter, the varnish was applied onto a separator film (PET film) by use of a roll coater and then dried in an oven of 70° C. for 10 minutes to obtain a 25 μm-thick transparency confirmation film on the separator.

As shown in FIG. 10, it was difficult to recognize an image on the rear side of the obtained transparency confirmation film through the film.

Subsequently, the varnish was weighed and silica particles SE2050 having an average particle size of 0.5 μm were mixed in accordance with the composition listed in Table 3 and stirred to disperse. Thereafter, the varnish was applied onto a separator film (PET film) by use of a roll coater and then dried in an oven of 70° C. for 10 minutes to obtain a 20 μm-thick insulating adhesive layer of a circuit-member connecting adhesive on a separator.

Comparative Example 2

A varnish for an adhesive resin composition was prepared in accordance with the composition listed in Table 3 in the same manner as in Comparative Example 1 and through the same steps as in Comparative Example 1. Thereafter, a transparency confirmation film was prepared and simultaneously an insulating adhesive layer of a circuit-member connecting adhesive was obtained.

Comparative Example 3

A varnish for an adhesive resin composition was prepared in accordance with the composition listed in Table 3 in the same manner as in Comparative Examples 1 and 2 and through the same steps as in Comparative Example 1. Thereafter, the varnish was applied onto a separator film (PET film) by use of a roll coater and then dried in an oven of 70° C. for 10 minutes to obtain a 20 μm-thick insulating adhesive layer of a circuit-member connecting adhesive on the separator.

Comparative Example 4

As a crosslinkable resin, an epoxy resin NC7000 (trade name, manufactured by Nippon Kayaku Co., Ltd.) was used. As a copolymerizable resin having a molecular weight of 1 million or less and a Tg of 40° C. or less and containing at least one functional group reactive to the crosslinkable resin in a side chain, an epoxy-group containing acrylic rubber HTR-860P-3 (trade name, manufactured by Nagase ChemteX Corporation, weight average molecular weight: 0.3 million) was used. As a hardening agent, 2PHZ (trade name, manufactured by Shikoku Chemicals Corporation), a silane coupling agent SH6062 (trade name, manufactured by Dow Corning Toray, Co., Ltd.), A1160 (trade name, manufactured by Nihon Unicar), and silica microparticle Aerosil (registered trade mark) R805 (trade name, manufactured by Japan Aerosil, primary particle size: 17 nm) were used. The aforementioned substances were dissolved in a toluene/ethyl acetate solvent mixture in accordance with the composition listed in Table 3 to obtain a varnish of an adhesive resin composition.

After the varnish mixture was stirred to disperse, it was applied onto a separator film (PET film) by a roll coater and then dried in an oven of 70° C. for 10 minutes to obtain a 25 μm-thick transparency confirmation film on the separator film. Subsequently, the same steps as in Comparative Example 1 were repeated to obtain a 20 μm-thick insulating adhesive layer of a circuit-member connecting adhesive on the separator.

Comparative Example 5

As a crosslinkable resin, an epoxy resin NC7000 (trade name, manufactured by Nippon Kayaku Co., Ltd.) was used. As a hardening agent reacting with the crosslinkable resin, phenol-aralkyl resin XLC-LL (trade name, manufactured by Mitsui Chemicals Inc.) was used. In place of the microencapsulated hardening agent, liquid epoxy resin Epicoat 828 (trade name, manufactured by Japan Epoxy Resins Co., Ltd.) and a hardening agent 2PHZ (trade name, manufactured by Shikoku Chemicals Corporation) were used. As a copolymerizable resin having a molecular weight of 1 million or less and a Tg of 40° C. or less and containing at least one functional group reactive to the crosslinkable resin in a side chain, an epoxy-group containing acrylic rubber HTR-860P-3 (trade name, manufactured by Nagase ChemteX Corporation, weight average molecular weight: 0.3 million), a silane coupling agent SH6040 (trade name, manufactured by Toray Dow Corning Silicone, Co., Ltd.) and silica microparticle Aerosil (registered trade mark) R805 (trade name, manufactured by Japan Aerosil, primary particle size: 17 nm) were used. The aforementioned substances were dissolved in a toluene/ethyl acetate solvent mixture in accordance with the composition listed in Table 3 to obtain a varnish of an adhesive resin composition.

After the varnish mixture was stirred to disperse, it was applied onto a separator film (PET film) by a roll coater and then dried in an oven of 70° C. for 10 minutes to obtain a 25 μm-thick transparency confirmation film on the separator film. Subsequently, the same steps as in Comparative Example 1 were repeated to obtain a 20 μm-thick insulating adhesive layer of a circuit-member connecting adhesive.

Comparative Example 6

A varnish for an adhesive resin composition was prepared in accordance with the composition listed in Table 3 in the same manner as in Example 1 except that the cordierite particles of Example 1 were replaced by silica microparticle Aerosil (registered trade mark) R805 (trade name, manufactured by Japan Aerosil, primary particle size: 17 nm). Thereafter, a transparency confirmation film was prepared and simultaneously an insulating adhesive layer of a circuit-member connecting adhesive was obtained.

TABLE 3

| Trade name or | Comparative Example | | | | | |
|---|---|---|---|---|---|---|
| material name | 1 | 2 | 3 | 4 | 5 | 6 |
| NC7000 | 15 | 15 | 15 | 50 | 15 | 15 |
| Epicoat 828 | — | — | — | — | 30 | — |
| XLC-LL | 15 | 15 | 15 | — | 15 | 15 |
| HTR-860P-3 | 20 | 20 | 20 | 50 | 20 | 20 |
| HX-3941HP | 50 | 50 | 50 | — | — | 50 |
| 2PHZ | — | — | — | 1.25 | 1.25 | — |
| SH6040 | 1 | 1 | 1 | — | 1 | 1 |
| SH6062 | — | — | — | 0.75 | — | — |
| A1160 | — | — | — | 1.5 | — | — |
| SE2050 | 100 | 25 | — | — | — | — |
| R805 | — | — | — | 15 | 15 | 15 |

(Unit: part by weight)

Comparative Examples 7 to 12

Transparency confirmation films having compositions listed in Table 2 were prepared in the same procedures as mentioned above except that conductive particles of 3 μm in average particle size, which were formed by providing a 0.2 μm-thick nickel layer on the surface of particles having a polystyrene core and providing a 0.04 μm thick gold layer outside the nickel layer, were mixed with the insulating adhesive layers obtained in Comparative Example 1 to 6 and a 5 μm-thick particle layer of a circuit-member connecting adhesive was obtained on the transparency confirmation films. The insulating adhesive layer and the particle layer were bonded by a laminator to obtain a 25 μm-thick circuit-member connecting anisotropic conductive adhesive.

TABLE 4

| Trade name or | Comparative Example | | | | | |
|---|---|---|---|---|---|---|
| material name | 7 | 8 | 9 | 10 | 11 | 12 |
| NC7000 | 15 | 15 | 15 | 50 | 15 | 15 |
| Epicoat 828 | — | — | — | — | 30 | — |
| XLC-LL | 15 | 15 | 15 | — | 15 | 15 |
| HTR-860P-3 | 20 | 20 | 20 | 50 | 20 | 20 |
| HX-3941HP | 50 | 50 | 50 | — | — | 50 |
| 2PHZ | — | — | — | 1.25 | 1.25 | — |
| SH6040 | 1 | 1 | 1 | — | 1 | 1 |
| SH6062 | — | — | — | 0.75 | — | — |
| A1160 | — | — | — | 1.5 | — | — |
| SE2050 | 100 | 25 | — | — | — | — |
| R805 | — | — | — | 15 | 15 | 15 |
| Conductive particles | 5 vol % | 5 vol % | 5 vol % | 5 vol % | 5 vol % | 5 vol % |

(Unit: part by weight)

(Laminate of semiconductor wafer/circuit-member connecting adhesive/dicing tape)

An adsorption stage of a die attach film mounter manufactured by JCM Co., Ltd. was heated to 80° C. Thereafter, a semiconductor wafer of 6-inch in diameter and 150 μm in thickness having gold-plated bumps formed thereon were mounted on the adsorption stage with a bump-side surface facing up.

The circuit-member connecting adhesives of Examples 1 to 5 and Comparative Examples 1 to 6 attached with separators were cut into pieces having a dimension of 200 mm×200 mm, which were laminated with an insulating adhesive layer side facing the bump side of the semiconductor wafer by pressing by the bonding roller of the die attach mounter from an end of the semiconductor wafer so as not to include air.

After the lamination, the portion of the adhesive running off the outer edge of the wafer was cut away. After cutting, the separator was peeled off and then a laminate of the wafer and the circuit-member connecting adhesive (from which the separator was already peeled off) was mounted on the adsorption stage of the die attach film mounter set at 40° C. with the surface attached with the adhesive facing up. Furthermore, a dicing frame for a 12-inch wafer was arranged along the circumference of the wafer.

UV-curable dicing tape UC-334EP-110 (trade name, manufactured by The Furukawa Electric Co., Ltd.) was laminated with a sticky surface facing the semiconductor wafer by pressing by the bonding roller of the die attach mounter from an end of the dicing frame so as not to include air.

After the lamination, the dicing tape was cut in the middle between the outer circumference and the inner circumference of the dicing frame to obtain a laminate of a semiconductor wafer/circuit-member connecting adhesive/dicing tape fixed on the dicing frame.

Dicing

The laminate of a semiconductor/circuit-member connecting adhesive/dicing tape fixed on the dicing frame was mounted on a full-automatic dicing saw DFD6361 (trade name) manufactured by Disco Corporation with the backgrind surface of the semiconductor wafer facing up. Alignment of a scribe line was performed through the wafer by use of an IR camera.

In the first stage, cut was made to 100 μm from the backgrind surface. The remaining wafer, circuit-member connecting adhesive and the part of the dicing tape were cut at intervals of 15.1 mm in the long side direction and at intervals of 1.6 mm in the short side direction. After cutting, washing was performed and moisture was blown out by blowing and then UV rays were applied to the dicing tape. Thereafter, the dicing tape was pushed up toward the semiconductor wafer to obtain semiconductor chips of 15.1 mm×1.6 mm having a circuit-member connecting adhesive formed on the bump side.

Pressure-bonding

The chip was suctioned in such a manner that the backgrind surface of the semiconductor chip with the circuit-member connecting adhesive faces the adsorption head of an ultrasonic flip-chip bonder SH-50MP (trade name, manufactured by Altecs Co., Ltd.). The chips was irradiated with light using a halogen light source manufactured by Moritex Corporation and a light guide from the circuit-member connecting adhesive side to recognize an alignment mark formed on the surface of the semiconductor chip. In this way, alignment was performed.

On the other hand, an alignment mark formed of ITO on a board having 1400 angstrom-thick indium-tin oxide (ITO) film electrodes formed on a 0.7 mm-thick non-alkali glass, was recognized and aligned. Thereafter, a chip was pressed at 0.5 MPa for one second on the glass board without heating. In this manner, a semiconductor chip was provisionally fixed on the glass board with the circuit-member connecting adhesive interposed between them.

Subsequently, the chip was pressed on the glass under the conditions: temperature: 210° C. and pressure: 50 MPa, for 5 seconds and simultaneously the adhesive was hardened. In this manner, bonding between the bump and the ITO electrodes and adhesion between the chip and the glass board were completed. After the pressure-bonding, a connection resistance value was checked.

After a connection resistance value was checked, the semiconductor chip-glass board united body was placed in a high-temperature/humidity apparatus (60° C. and 90% RH) or a cycle tester (−40° C., 15 minutes and 100° C., 15 minutes) in order to check the connection reliability of the circuit-member connecting adhesive. After a certain time period, a change in connection resistance was measured.

Measurement of Linear Expansion Coefficient

Each of the circuit-member connecting adhesives according to Examples and Comparative Examples was placed together with a separator in an oven set at 180° C. for 3 hours to perform a heat hardening treatment. After heat hardening, the film was peeled off from the separator and cut into pieces of 30 mm×2 mm in size. Using TMA/SS6100 (trade name, manufactured by Seiko Instruments Inc. (after the distance of chucks was set at 20 mm)), thermo mechanical analysis was performed in the conditions: measurement temperature range: 20° C. to 300° C., temperature raising rate: 5° C./min, loading condition: 0.5 MPa-pressure/sectional area, in accordance with a tensile test mode to obtain a linear expansion coefficient.

Measurement of Reactivity

Each of the circuit-member connecting adhesives according to Examples and Comparative Examples (2 to 10 mg) was weighed in an aluminum measurement container and measured for a calorific value by DSC Pylis 1 (trade name) manufactured by Perkin Elmer, Inc in the range from 30 to 300° C., at a temperature raising rate of 20° C./min. This is regarded as an initial calorific value.

Subsequently, the temperature of the heat head of a thermocompression bonding apparatus was set at a temperature such that temperature reached 180° C. in 20 seconds after the temperature was confirmed by a thermocouple sandwiched between separators. The circuit-member connecting adhesive sandwiched between separators was heated for 20 seconds by the heating head set at the conditions. In this way, a film to which the same heat treatment as a thermocompression bonding process was applied was obtained. After the heat treatment, the film (2 to 10 mg) was weighed and placed in an aluminum measurement container and subjected to calorific value measurement performed by DSC from 30 to 300° C. at a temperature increased rate of 20° C./min. This is regarded as a calorific value after heating. A reactivity (%) was calculated from the calorific values obtained, in accordance with the following formula:

(Initial calorific value−calorific value after heating)/(initial calorific value)×100.

Properties of the circuit-member connecting adhesives, more specifically, parallel transmittance, linear expansion coefficient after hardening, whether a recognition mark is observed or not by a flip-chip bonder, reactivity and further a connection resistance value after pressure-bonding, and a connection resistance value after the reliability test are shown in Tables 5 and 6 with respect to each of Examples and Comparative Examples.

TABLE 5

| Item | Example 1 | 2 | 3 | 4 | 5 | 6 | 7 |
|---|---|---|---|---|---|---|---|
| Parallel transmittance (%) | 18 | 25 | 29 | 33 | 32 | 29 | 18 |
| Linear expansion coefficient (40-100° C.) (×10$^{-6}$/° C.) | 38 | 48 | 58 | 69 | 26 | 58 | 35 |
| Recognition of chip alignment mark | Recognized | Recognized | Recognized | Recognized | Recognized | Recognized | Recognized |
| Reactivity (%) | 89 | 88 | 89 | 86 | 89 | 89 | 92 |
| Connection resistance after pressure-bonding (Ω) | 0.2 | 0.4 | 0.5 | 4.7 | 1.6 | — | — |
| Connection resistance after high-temperature/humidity test (200 h)(Ω) | 48 | 60 | 220 | 330 | 150 | — | — |
| Connection resistance after temperature cycle test (200 cycles) (Ω) | 20 | 40 | 100 | 200 | 60 | — | — |

TABLE 6

| Item | Comparative Example | | | | | |
|---|---|---|---|---|---|---|
| | 1 | 2 | 3 | 4 | 5 | 6 |
| Parallel transmittance (%) | 2 | 7 | 60 | 15 | 45 | 47 |
| Linear expansion coefficient (40-100° C.) ($\times 10^{-6}/°$ C.) | 42 | 82 | 88 | 170 | 102 | 87 |
| Recognition of chip alignment mark | Not recognized | Not recognized | Recognized | Recognized | Recognized | Recognized |
| Reactivity (%) | 88 | 86 | 88 | 1 | 0 | 86 |
| Connection resistance after pressure-bonding (Ω) | Conductive failure | Conductive failure | 10.2 | Conductive failure | Conductive failure | 0.7 |
| Connection resistance after high-temperature/humidity test (200 h) (Ω) | — | — | Conductive failure | — | — | Conductive failure |
| Connection resistance after temperature cycle test (200 cycles) (Ω) | — | — | Conductive failure | — | — | Conductive failure |

As shown in Table 5, the circuit-member connecting adhesives employing cordierite or aluminum borate having a refractive index of 1.5 to 1.7 as composite oxide particles have a parallel transmittance of 15% or more and a turbidity of 85% or less. Therefore, it is possible to recognize a recognition mark on a chip circuit surface through the adhesive by use of a recognition system of a flip-chip bonder. Since composite oxide particles having a low thermal expansion coefficient are contained, the linear expansion coefficient after hardening is reduced. In addition, in the connection reliability test, the reactivity reaches 80% or more in the heating conditions during a thermocompression bonding process where no conductive failure occurs. It is confirmed that a low connection resistance can be stably shown. Therefore, it is apparent that they are excellent adhesives for flip-chip connection.

On the other hand, as shown in Table 5, in Comparative Examples 1 and 2, the turbidities are large and the parallel transmittances are low since silica having a refractive index of 1.46 is used. A recognition operation cannot be performed by a flip-chip bonder and alignment cannot be performed. As a result, the semiconductor apparatus cannot ensure initial conductivity. In Comparative Example 3, since composite oxide particles are not added, a linear expansion coefficient is large, causing conductive failure. In Comparative Examples 4 and 5, the reactivity is low and rapid hardening cannot be made. As a result, conductive failure occurs in the semiconductor device. Furthermore, in Comparative Example 6, since Aerosil (registered trade mark) has a large specific surface area, the amount that can be blended to a resin is low. Because of the low content, it is difficult to reduce a linear expansion coefficient. As a result, disadvantages such as conductive failure inevitably occur.

INDUSTRIAL APPLICABILITY

The film-type adhesive for connecting circuit members of the present invention can provide a semiconductor chip with an adhesive for use in a preset underfill method capable of dealing with narrow-pitch and narrow-gap tendency without causing contamination during a dicing process and capable of peeling off from a dicing tape after dicing; furthermore can be used as a rapid-hardening circuit-member connecting adhesive for applying to a wafer capable of attaining not only transparency for realizing accurate alignment of adhesive chips but also high connection reliability due to a low thermal expansion coefficient.

The invention claimed is:

1. A semiconductor device comprising:
   (i) an electronic component comprising a semiconductor chip having protruding connecting terminals; and
   (ii) a board having wiring patterns formed thereon, wherein the electronic component and the board are electrically connected by an adhesive,
   wherein the adhesive is interposed between the semiconductor chip and the board for electrically connecting the protruding connecting terminals and the wiring patterns facing each other, and for bonding the semiconductor chip and the board by applying pressure/heat,
   wherein the adhesive comprises:
   (a) a resin composition comprising a thermoplastic resin, a crosslinkable resin and a hardening agent for forming a crosslink structure of the crosslinkable resin; and
   (b) composite oxide particles having a refractive index between 1.5 to 1.7 comprising cordierite particles dispersed in the resin composition.

2. The semiconductor device according to claim 1, wherein a refractive index difference between the resin composition and the composite oxide particles falls within ±0.06.

3. The semiconductor device according to claim 1, wherein the composite oxide particles have a refractive index of 1.5 to 1.7 and are particles formed of a composite oxide comprising two or more types of metal elements.

4. The semiconductor device according to claim 1, wherein the composite oxide particles are particles formed of at least one type of metal element selected from aluminum and magnesium, and an oxide comprising a metal element except the metal elements or a metalloid element.

5. The semiconductor device according to claim 4, wherein the metalloid element is silicon and/or boron.

6. The semiconductor device according to claim 1, wherein the composite oxide particles are particles comprising a composite oxide having a specific gravity of 4 or less.

7. The semiconductor device according to claim 1, wherein the composite oxide particles are composite oxide particles having an average particle size of 15 μm or less.

8. The semiconductor device according to claim 1, wherein the composite oxide particles are comprised in an amount of 25 to 200 parts by weight relative to 100 parts by weight of the resin composition.

9. The semiconductor device according to claim 1, wherein a visible-light parallel transmittance of the adhesive in an unhardened state is 15 to 100%.

10. The semiconductor device according to claim 1, wherein a reactivity of the adhesive, obtained after heating at 180° C. for 20 seconds and measured by a differential scanning calorimeter, is 80% or more.

11. The semiconductor device according to claim 1, wherein a linear expansion coefficient of the adhesive, measured at 40° C. to 100° C. after hardening, is $70 \times 10^{-6}/°$ C. or less.

12. The semiconductor device according to claim 1, wherein the thermoplastic resin is a copolymerizable resin having a weight average molecular weight of 1 million or less and a glass transition temperature of 40° C. or less, and having a reactive functional group with the crosslinkable resin in a side chain, wherein the crosslinkable resin is an epoxy resin, and wherein the hardening agent is a microencapsulated hardening agent.

13. The semiconductor device according to claim 1, the adhesive further comprising (c) conductive particles having an average particle size of 3 to 5 μm dispersed therein.

* * * * *